United States Patent
Desroches

(10) Patent No.: US 6,472,927 B1
(45) Date of Patent: Oct. 29, 2002

(54) CIRCUIT HAVING INCREASED NOISE IMMUNITY AND CAPABLE OF GENERATING A REFERENCE VOLTAGE OR TERMINATING A TRANSMISSION LINE

(75) Inventor: Alan R. Desroches, San Jose, CA (US)

(73) Assignee: Hewlett-Packard Compnay, Palo Alto, CA (US)

(*) Notice: Subject to any disclaimer, the term of this patent is extended or adjusted under 35 U.S.C. 154(b) by 0 days.

(21) Appl. No.: 09/703,603

(22) Filed: Oct. 30, 2000

(51) Int. Cl.[7] .................................................. G05F 1/10
(52) U.S. Cl. ........................ 327/538; 327/541; 327/543
(58) Field of Search .................................. 327/538, 541, 327/542, 543, 108; 307/15; 323/313, 314, 315; 326/30, 80

(56) References Cited

U.S. PATENT DOCUMENTS 5,528,172 A * 6/1996 Sundstrom .................... 326/80
5,694,065 A * 12/1997 Hamasaki et al. .......... 327/108

* cited by examiner

*Primary Examiner*—Tuan T. Lam
*Assistant Examiner*—Hiep Nguyen
(74) *Attorney, Agent, or Firm*—David A. Plettner

(57) ABSTRACT

A voltage divider suppresses noise in a voltage divider output by filtering the voltages at the gate terminals of the transistors that comprise a voltage divider. In one embodiment of the present invention, a voltage divider includes a PFET transistor coupled between a voltage VDD and the voltage divider output, and an NFET transistor coupled between a voltage VSS and the voltage divider output, with a resistor-capacitor (RC) filter provided at each gate terminal of each of the transistors. In a second embodiment, the RC filter is fabricated using only transistors. In both embodiments, noise is filtered out at the gate terminal of the transistors, thereby eliminating noise in the resulting voltage divider output. Accordingly, a capacitor is not required between the voltage divider output and VSS, as in the prior art.

11 Claims, 3 Drawing Sheets

CIRCUIT HAVING INCREASED NOISE IMMUNITY AND CAPABLE OF GENERATING A REFERENCE VOLTAGE OR TERMINATING A TRANSMISSION LINE

FIELD OF THE INVENTION

The present invention relates to a circuit that can function as a reference voltage generator or can provide termination at the end of a transmission line, and uses a filter network to provide increased noise immunity.

DESCRIPTION OF THE RELATED ART

In the art of digital systems, voltage dividers are used in many applications, such as generating a threshold voltage that is provided to one input of a differential receiver to detect a single-ended signal provided to the other input of the differential receiver, or providing termination at the end of a transmission line.

FIG. 1 shows a simple prior art voltage divider 10. Note that the term PFET will be used herein to reference a p-channel metal-oxide semiconductor field effect transistor (MOSFET). This type of transistors is also commonly known in the art as a PMOS transistor. Similarly, the term NFET will be used herein to reference an n-channel MOSFET. This type of transistors is also commonly known in the art as an NMOS transistor.

Voltage divider 10 comprises a PFET transistor 12 coupled between the voltage VDD, and the voltage divider output VOUT, and a NFET transistor 14 coupled between the voltage VSS and the voltage divider output VOUT. The gate terminal of PFET transistor 12 is coupled to VSS, and the gate terminal of NFET transistor 14 is coupled to VDD. The voltage present at the voltage divider output VOUT is halfway between the voltages of VDD and VSS.

One of the problems associated with the voltage divider configuration shown in FIG. 1 is noise. In FIG. 1, noise present in VSS will be amplified by PFET transistor 12 and appear on the output VOUT. Similarly, noise present in VDD will be amplified by NFET transistor 14 and appear on the output VOUT. Such noise is often present in digital systems, and when amplified by transistors 12 and 14, can degrade the performance of any circuit that depends on the reference voltage, such as a differential receiver or transmission line termination.

One prior art solution to this problem is to couple one or more capacitors between the voltage divider output and VSS, as is shown in FIG. 2. In FIG. 2, a voltage divider 16 comprises a PFET transistor 18 coupled between the voltage VDD, and the voltage divider output VOUT, and a NFET transistor 20 coupled between the voltage VSS and the voltage divider output VOUT. The gate terminal of PFET transistor 18 is coupled to VSS, and the gate terminal of NFET transistor 20 is coupled to VDD. Furthermore capacitor 24 is coupled between the voltage divider output VOUT and VSS. Unfortunately, to provide effective noise suppression for all circuits that require VOUT, especially in view of the amplification of noise produced by transistors 18 and 20, capacitor 24 must have a relatively large capacitance C. As is known in the art, large capacitances require a relatively large area on an integrated circuit, and therefore consume integrated circuit resources that could otherwise be used for other circuits.

SUMMARY OF THE INVENTION

The present invention is a voltage divider that suppresses noise in the voltage output by filtering the voltages at the gate terminals of the transistors that comprise the voltage divider. In a first embodiment of the present invention, a voltage divider includes a PFET transistor coupled between a voltage VDD and the voltage divider output, and an NFET transistor coupled between a voltage VSS and the voltage divider output. A resistor-capacitor (RC) filter is provided at each gate terminal of each of the transistors. Each RC filter is comprised or N RC stages, where N is equal to or greater than 1. For example, a four-stage RC filter coupled to the gate terminal of the PFET transistor comprises four resistors coupled in series between the gate terminal of the PFET transistor and the voltage VSS. At each of the nodes between the resistors, and at the node coupling the gate terminal of the PFET transistor to one of the resistors, a capacitor is coupled between the respective node and the voltage VDD. Similarly, a four-stage RC filter coupled to the gate terminal of the NFET transistor comprises four resistors coupled in series between the gate terminal of the NFET transistor and the voltage VDD. At each of the nodes between the resistors, and at the node coupling the NFET transistor to one of the resistors, a capacitor is coupled between the respective node and the voltage VSS.

In a second embodiment, the RC filter is fabricated using only transistors. One or more transistors having source and drain terminals coupled in series are used as resistors, and one or more transistors having source and drain terminals coupled together are used as capacitors, with the gate terminal serving as one terminal of the capacitor and the coupled source and drain terminals acting as another terminal of the capacitor. The transistors used as resistors also provide additional capacitance.

In both embodiments, noise present in VSS is eliminated at the gate terminal of the PFET transistor, and noise in VDD is eliminated at the gate terminal of the NFET transistor. Furthermore, noise present in VDD is applied to the source terminal of the PFET, and is also coupled to the gate terminal of the PFET by the capacitors, thereby keeping the source-to-gate voltage of the PFET constant and eliminating noise at the drain terminal of the PFET. Similarly, noise present in VSS is applied to the source terminal of the NFET, and is also coupled to the gate terminal of the NFET by the capacitors, thereby keeping the source-to-gate voltage of the NFET constant and eliminating noise at the drain terminal of the NFET. Since the present invention removes noise from the gate terminals of the transistors before the noise is amplified by the transistors, the resulting voltage divider output does not contain noise, and therefore a capacitor is not required between the output and VSS, as in the prior art. Since the filter is provided at the relatively high-impedance gate terminals of the NFET and PFET transistors, the capacitance values required in the RC filter can be relatively small. Accordingly, the present invention consumes a smaller area of the integrated circuit compared to prior art techniques. In addition, the present invention is easily extendable to past and future generations of MOS technology.

DETAILED DESCRIPTION OF THE PREFERRED EMBODIMENTS

The present invention is a voltage divider that suppresses noise in the resulting voltage output by filtering the voltages at the gate terminals of the transistors that comprise a voltage divider. The voltage divider can function as a reference voltage generator, can provide termination at the end of a transmission line, or be used an any other application where a voltage divider having high noise immunity would be beneficial. The noise is filtered using a resistor-capacitor (RC) filter provided at each gate terminal of each of the transistors. Each RC filter is comprised or NRC stages, where N is equal to or greater than 1.

Figure 2:
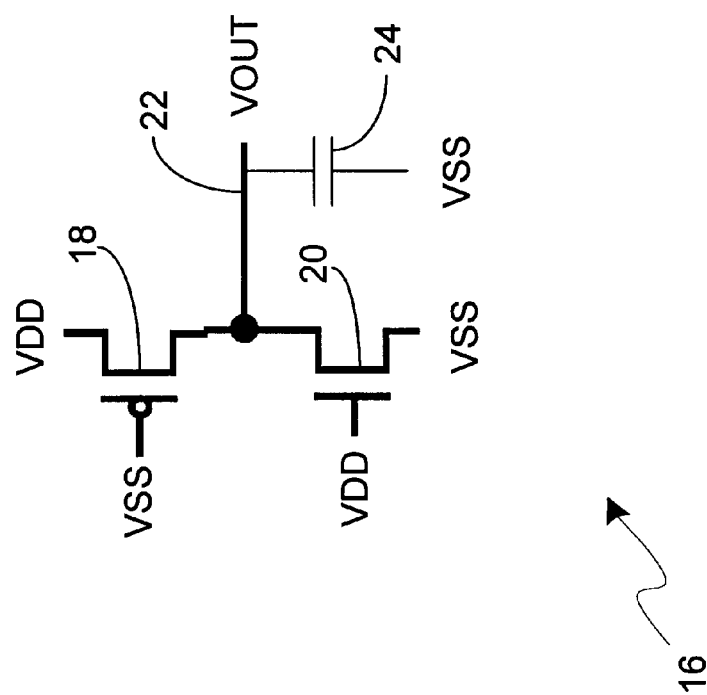
FIG. 2 shows a prior art voltage divider having a capacitor coupled between the voltage divider output and a voltage VSS to filter noise present in the output.
Figure 1:
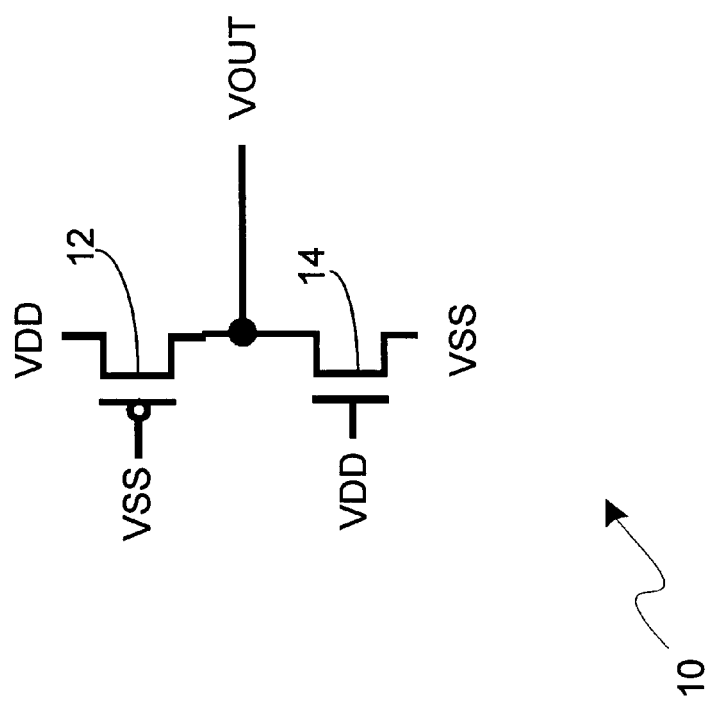
FIG. 1 shows a simple prior art voltage divider.
Figure 3:
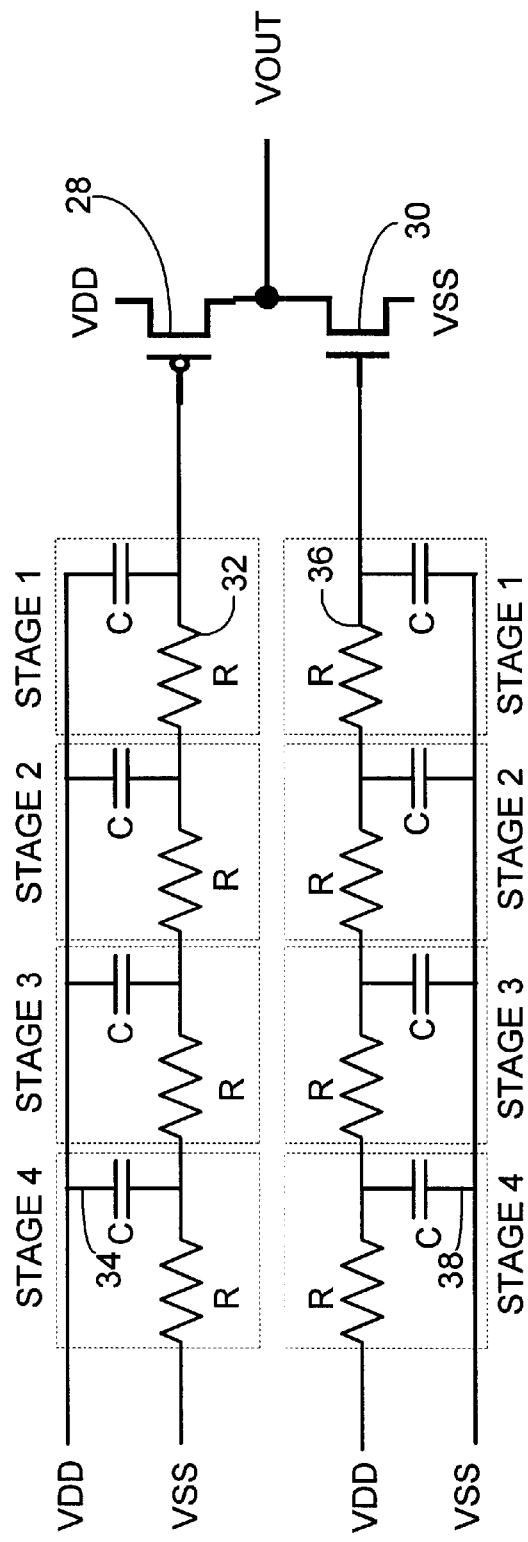
FIG. 3 is a schematic diagram showing a first embodiment of a voltage divider in accordance with the present invention.

FIG. 3 is a schematic diagram showing a first embodiment of a voltage divider 26 in accordance with the present invention. Similar to the prior art voltage dividers of FIG. 1 and 2, voltage divider 26 includes a PFET transistor 28 coupled between the voltage VDD and the voltage divider output VOUT, and an NFET transistor 30 coupled between the voltage VSS and the voltage divider output VOUT. However, unlike the prior art voltage divider in FIG. 2, which has a capacitor coupled between VOUT and VSS to suppress noise, the voltage divider of the present invention suppresses noise by providing a resistor-capacitor (RC) filter on the gate terminals of transistors 28 and 30. Since the input impedance found at the gate terminals is relatively high, the capacitances of the capacitors used in the RC filter can be much smaller, thereby consuming less area of the integrated circuit.

The RC filter coupled to the gate terminal of PFET transistor 28 is constructed using four RC stages. Accordingly, the RC filter comprises four resistors, such as resistor 32, coupled in series between the gate terminal of transistor 28 and the voltage VSS. At each of the nodes between the resistors, and at the node between resistor 32 and the gate terminal of transistor 28, a capacitor, such as capacitor 34, is coupled between the respective node and the voltage VDD.

Similarly, the RC filter coupled to the gate terminal of NFET transistor 30 is constructed using four RC stages. Accordingly, the RC filter comprises four resistors, such as resistor 36, coupled in series between the gate terminal of transistor 30 and the voltage VDD. At each of the nodes between the resistors, and at the node between resistor 36 and the gate terminal of transistor 30, a capacitor, such as capacitor 38, is coupled between the respective node and the voltage VSS.

Figure 4:
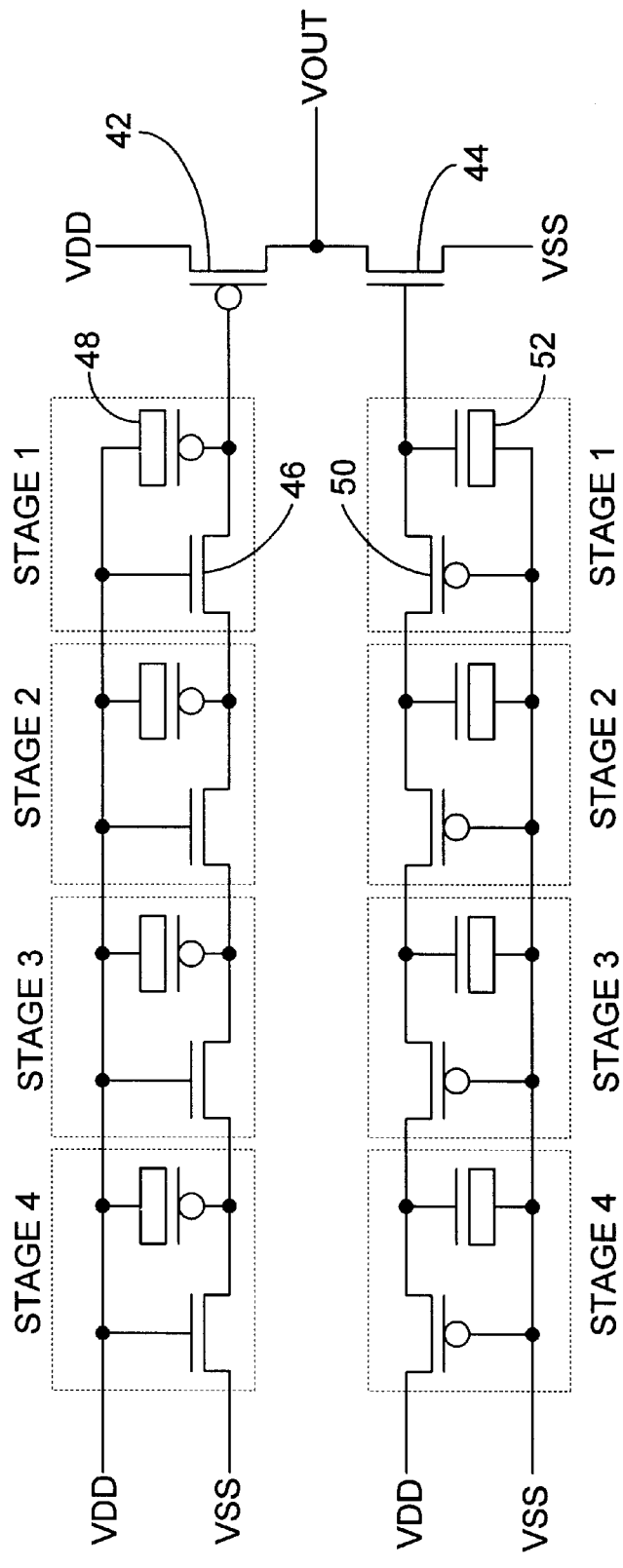
FIG. 4 is a schematic diagram showing a second embodiment of a voltage divider fabricated exclusively with transistors, in accordance with the present invention.

As is known in the art, when using MOS fabrication techniques it is much easier and more efficient to fabricate transistors than it is to fabricate resistors and capacitors. FIG. 4 shows a functionally equivalent second embodiment of the present invention fabricated solely from transistors. In FIG. 40, voltage divider 40 includes a PFET transistor 42 coupled between the voltage VDD, and the voltage divider output VOUT, and a NFET transistor 44 coupled between the voltage VSS and the voltage divider output VOUT.

However, in contrast to the RC filter shown in FIG. 3, the RC filter of voltage divider 40 is fabricated using only transistors. The RC filter coupled to the gate terminal of PFET transistor 42 is constructed using four RC stages. Accordingly, the RC filter comprises four NFET transistors, such as transistor 46, having their respective source and drain terminals coupled in series between the gate terminal of transistor 42 and the voltage VSS. The gate terminal of each of these four NFET transistors is coupled to VDD, and these transistors function as resistors. Note that these transistors also provide additional capacitance. At each of the nodes between the four NFET transistors, and at the node between transistor 46 and the gate terminal of PFET 42, a PFET transistor, such as transistor 48, has a source and a drain terminal coupled to VDD, and a gate terminal coupled to the respective node. These four PFET transistors function as capacitors.

Similarly, the RC filter coupled to the gate terminal of NFET transistor 44 is constructed using four RC stages.

Accordingly, the RC filter comprises four PFET transistors, such as transistor 50, having their respective source and drain terminals coupled in series between the gate terminal of transistor 44 and the voltage VDD. The gate terminal of each of these four PFET transistors is coupled to VSS, and these transistors function as resistors. Note that these transistors also provide additional capacitance. At each of the nodes between the four PFET transistors, and at the node between transistor 50 and the gate terminal of transistor 44, an NFET transistor, such as transistor 52, has a source and a drain terminal coupled to VSS, and a gate terminal coupled to the respective node. These four NFET transistors function as capacitors.

In the embodiments shown in FIGS. 3 and 4, noise present in VSS is eliminated at the gate terminal of the PFET transistor, and noise in VDD is eliminated at the gate terminal of the NFET transistor. Furthermore, noise present in VDD is applied to the source terminal of the PFET, and is also coupled to the gate terminal of the PFET by the capacitors, thereby keeping the source-to-gate voltage of the PFET constant and eliminating noise in at the drain terminal of the PFET. Similarly, noise present in VSS is applied to the source terminal of the NFET, and is also coupled to the gate terminal of the NFET by the capacitors, thereby keeping the gate-to-source voltage of the NFET constant and eliminating noise at the drain terminal of the PFET. Since the present invention removes noise from the gate terminals of the transistors before the noise is amplified by the transistors, the resulting voltage divider output does not contain noise, and therefore a capacitor is not required between the output and VSS, as in the prior art.

As is known in the art, the magnitude of attenuation of a single stage of an RC lowpass filter is:

$$\left|\frac{V_O}{V_I}\right| = \left|\frac{1}{\sqrt{1^2 + (2\pi fRC)^2}}\right|$$

Where $V_O$ is the output voltage, $V_I$ is the input voltage, R is the resistance of the resistor, C is the capacitance of the capacitor, and f is the frequency.

Assume that the present invention is being used in proximity to a reciever circuit operating at 200 MHz, and the designer wishes to reduce noise at the gate inputs of the NFET and PFET from 200 mV to 10 mV, which is a factor of 0.05. Further assume that the designer selects a cutoff frequency of 100 MHz and therefore selects R and C of a single RC stage such that the reciprocal of 2*π*R*C equals 100 MHz. The attenuation at 100 MHz will be the reciprocal of square root of two, or alternatively, 0.71. At 200 MHz, the attenuation will be the reciprocal of square root of five, or alternatively, 0.45. Note that this does not reach our desired attenuation of 0.50. At 200 MHz, a second stage will produce an attenuation of 0.20, a third stage will produce an attenuation of 0.09, and a fourth stage will produce an attenuation of 0.04. Accordingly, four stages are required to reach the desired attenuation given the assumptions above.

Now assume that voltage divider 26 of FIG. 3 is being used to terminate a transmission line with a 50Ω termination. To achieve this termination resistance, PFET 18 and NFET 20 will each have output impedances of 100Ω. Again, assume that the cutoff frequency of the RC filter is 100 MHz. Also assume that the designer uses 5 KΩ resistors to form the RC filter in FIG. 3. Note that to provide a single stage of the same RC filter in prior art voltage divider 16 of FIG. 2, the capacitor would have to be 100 times larger than the capacitors in FIG. 3 because the 50Ω output impedance is 100 times smaller than the 5 KΩ resistors.

However, this does not tell the whole story, because the transistors in FIG. 2 will amplify the noise. A typical amplification ratio could be in the range of five to ten, so the capacitor in FIG. 2 would need to be 500 to 1000 times large as the capacitors in FIG. 3. And keep in mind that this is only a single stage, so the attenuation at 200 MHz will only be 0.45. The cutoff frequency could be lowered, which would lower the attenuation, or alternatively, additional stages could be added, but both options would require significantly more capacitance. Accordingly, the present invention provides a dramatic improvement over the prior art.

Note that a variety of other filter configurations known in the art may be used at the gate terminals of the NFET and PFET transistors, and one implementing the present invention may choose a filter configuration that is appropriate for the digital system in which the present invention is being used. Also, one implementing the present invention may choose to use more or fewer RC stages.

As discussed above, since the RC filter is provided at the relatively high input impedance gate terminals of the NFET and PFET transistors, the capacitance values required in the RC filter can be relatively small. Accordingly, the present invention consumes a smaller area of the integrated circuit compared to prior art techniques, especially when the all-transistor embodiment shown in FIG. 4 is employed. In addition, the present invention is easily extendable to past and future generations of MOS technology.

Although the present invention has been described with reference to preferred embodiments, workers skilled in the art will recognize that changes may be made in form and detail without departing from the spirit and scope of the invention.

What is claimed is:

1. A voltage divider for providing an output voltage between first and second voltages comprising:
    a first transistor having a first terminal coupled to the first voltage, a second terminal coupled to the output voltage, and a gate terminal;
    a first RC filter having at least one resistor coupled between the second voltage and the gate input of the first transistor, and at least one capacitor coupled between the first voltage and the gate input of the first transistor;
    a second transistor having a first terminal coupled to the output voltage, a second terminal coupled to the second voltage, and a gate terminal; and
    a second RC filter having at least one resistor coupled between the first voltage and the gate input of the second transistor, and at least one capacitor coupled between the second voltage and the gate input of the second transistor.

2. The voltage divider of claim 1 wherein the first transistor is a p-channel field effect transistor and the second transistor is an n-channel field effect transistor.

3. The voltage divider of claim 1 wherein the first and second RC filters each comprise a plurality of RC filter stages.

4. The voltage divider of claim 1 wherein the first and second RC filters are formed solely from field effect transistors.

5. The voltage divider of claim 4 wherein the first RC filter comprises:
    at least one NFET transistor having source and drain terminals coupled between the second voltage and the gate input of the first transistor and a gate input coupled to the first voltage, and at least one PFET transistor having source and drain terminals coupled to the first voltage and a gate input coupled to the gate input of the first transistor;
    and the second RC filter comprises:
    at least one PFET transistor having source and drain terminals coupled between the first voltage and the gate input of the second transistor and a gate input coupled to the second voltage, and at least one NFET transistor having source and drain terminals coupled to the second voltage and a gate input coupled to the gate input of the second transistor.

6. The voltage divider of claim 1 wherein the voltage divider output voltage generates a reference voltage output that is coupled to one input of a differential receiver to detect a single-ended signal that is provided to another input of the differential receiver.

7. The voltage divider of claim 1 wherein the voltage divider output voltage is coupled to the end of a transmission line to terminate the transmission line.

8. A voltage divider for providing an output voltage between first and second voltages comprising:
    a first transistor having a first terminal coupled to the first voltage, a second terminal coupled to the output voltage, and a gate terminal;
    a first filter coupled between the second voltage and the gate input of the first transistor, for attenuating noise at the gate input of the first transistor, wherein the first filter comprises at least one NFET transistor having source and drain terminals coupled between the second voltage and the gate input of the first transistor and a gate input coupled to the first voltage, and at least one PFET transistor having source and drain terminals coupled to the first voltage and a gate input coupled to the gate input of the first transistor;
    a second transistor having a first terminal coupled to the output voltage, a second terminal coupled to the second voltage, and a gate terminal; and
    a second filter coupled between the first voltage and the gate input of the second transistor, for attenuating noise at the gate input of the second transistor, wherein the second RC filter comprises at least one PFET transistor having source and drain terminals coupled between the first voltage and the gate input of the second transistor and a gate input coupled to the second voltage, and at least one NFET transistor having source and drain terminals coupled to the second voltage and a gate input coupled to the gate input of the second transistor.

9. The voltage divider of claim 8 wherein the first transistor is a p-channel field effect transistor and the second transistor is an n-channel field effect transistor.

10. The voltage divider of claim 8 wherein the voltage divider output voltage generates a reference voltage output that is coupled to one input of a differential receiver to detect a single-ended signal that is provided to another input of the differential receiver.

11. The voltage divider of claim 8 wherein the voltage divider output voltage is coupled to the end of a transmission line to terminate the transmission line.

* * * * *